United States Patent [19]

Chen et al.

[11] Patent Number: 5,767,549
[45] Date of Patent: Jun. 16, 1998

[54] SOI CMOS STRUCTURE

[75] Inventors: Wei Chen, Croton-on-Hudson; Devendra Kumar Sadana, Pleasantville; Yuan Taur, Bedford, all of N.Y.

[73] Assignee: International Business Machines Corporation, Armonk, N.Y.

[21] Appl. No.: 678,442

[22] Filed: Jul. 3, 1996

[51] Int. Cl.$^6$ .................................................. H01L 27/01
[52] U.S. Cl. .......................................... 257/347; 257/351
[58] Field of Search ............................ 257/347, 351, 257/369, 348, 349, 350, 352, 354, 507, 66, 67, 74, 75, 524, 353, 371

[56] References Cited

U.S. PATENT DOCUMENTS

| H1435 | 5/1995 | Cherne et al. |  |
|---|---|---|---|
| 4,193,836 | 3/1980 | Youmans et al. | 156/657 |
| 4,276,688 | 7/1981 | Hsu . |  |
| 5,145,802 | 9/1992 | Tyson et al. | 437/63 |
| 5,159,416 | 10/1992 | Osamu . |  |
| 5,399,519 | 3/1995 | Matloubian . |  |
| 5,463,238 | 10/1995 | Takahashi et al. | 257/351 |
| 5,489,792 | 2/1996 | Hu et al. . |  |

FOREIGN PATENT DOCUMENTS

| 5-251647 | 9/1993 | Japan | 257/371 |
|---|---|---|---|

OTHER PUBLICATIONS

J. P. Colinge. *Silicon–on–Insulator Technology: Materials to VLSI*, New York: Kluwer, 1991.

G. G. Shahidi et al., "A room temperature 0.1 um CMOS on SOI", IEEE Trans. Elect. Dev., vol. 41, No. 12, (1994).

C. E. Chen et al., "Single transistor latch in SOI MOSFET's", IEEE Trans. Elect. Dev. Lett., 97 (1988).

C. B. Oh et al., "The effect of body contact arrangement on thin SOI MOSFET Characteristics", Microelectronic Engineering, vol. 28, 367–470, (1995).

M. Matloubian, "A smart body contact for SOI MOSFET's", Proc. IEEE SOS/SOI Tech. Conf., 128 (1989).

M. Chan et al., "Comparative Study of Fully Depleted and Body–Grounded Non Fully Depleted SOI MOSFET's for High Performance Analog and Mixed Signal Circuits", IEEE Trans. on Electron Devices, vol. 42 No. 11, Nov. 1995.

N. H. E. Weste et al., "Principles of CMOS VLSI Design", A Systems Perspective, Second Edition, pp. 133 and 134.

Sze, S.M., *Physics of Semiconductor Devices*, 2nd ed., John Wiley, 1981, p. 439.

*Primary Examiner*—Sara W. Crane
*Attorney, Agent, or Firm*—Robert M. Trepp

[57] ABSTRACT

An integrated circuit is described incorporating a substrate, a layer of insulator, a layer of silicon having raised mesas and thin regions therebetween to provide ohmic conduction between mesas, electronic devices on the mesas, and interconnection wiring. The invention overcomes the problem of a floating gate due to charge accumulation below the channel of MOS FET's.

5 Claims, 13 Drawing Sheets

SOI CMOS STRUCTURE

GOVERNMENT CONTRACT

This invention was made with Government support under Contract No. N66001-93-C-6005 awarded by the Department of the Navy. The Government has certain rights in this invention.

FIELD OF THE INVENTION

This invention relates to semiconductor-on-insulator (SOI) integrated circuits and more particularly, to a structure for removing floating body effects of field effect transistors (FET's) which degrade the performance of SOI Complementary Metal Oxide Semiconductor (CMOS) FET circuits.

BACKGROUND OF THE INVENTION

Recently there have been a surge of research activities on SOI devices due to their applicability to low-power, high-speed VLSI, and due to many advantages that they exhibit over devices built on bulk semiconductor substrates. The advantages include 1) less junction capacitance so higher circuit speed can be achieved; 2) better device isolation and free from latchup; and 3) radiation hardness which is especially important for single event upset (SEU) sensitive memory applications.

SOI floating body effects of FET's cause unwanted effects such as kinks in drain current versus gate voltage, anomalous subthreshold current, transient current overshoot, and early device voltage $V_{DS}$ breakdown. The kink effect results in much lower device gain, which is especially unwanted in analog applications. The anomalous subthreshold currents, on the other hand, cause much higher device off current, which is very bad in digital applications. Despite the advantages of SOI FET circuits, the floating body effects remain one of the main obstacles that block SOI from entering the main stream of applications such as CMOS logic circuits.

Over the years, a number of methods have been proposed to either eliminate or minimize the floating body effect. One of the methods is to use ultra-thin fully depleted devices where the Si channel film thickness is less than the depletion width of the device such as described by J. P. Colinge, "Silicon-on-Insulator Technology: Materials to VLSI", New York: Kluwer, 1991. However this method has difficulties, especially in applying it to short channel SOI devices. In short channel devices, the use of relatively high channel doping, for example, in the range of 3 to $6\times10^{17}$ cm$^3$ is necessary to prevent punch-through. This results in an ultra-thin Si channel that can be used for fully depleted devices e.g. about 300 Å. A number of SOI material quality, uniformity, and processing problems exist in the thickness regime of about 300 Å and have not been solved.

Another method of eliminating the floating body effect has been to use a body contact for every device, which would result in substantial area penalty and wiring complexity such as described by M. Matloubian, "A smart body contact for SOI MOSFET's", Proc. IEEE SOS/SOI Tech. Conf., 128 (1989) and by C. B. Oh et al., "The effect of body contact arrangement on thin SOI MOSFET characteristics", Microelectronic Engineering, Vol. 28, 367 (1995).

In U.S. Pat. No. 5,145,802 which issued Sep. 8, 1992 to S. M. Tyson et al., a buried body tie between two transistors is shown where the buried body tie is an extension of the silicon mesa about 500 Å thick to an adjacent mesa. Other mesas are isolated from one another by local oxidation of silicon (LOCOS) that extends down to the buried oxide layer.

SUMMARY OF THE INVENTION

In accordance with the present invention, an integrated circuit and method for making is described comprising a substrate, a layer of dielectric material on the substrate such as silicon dioxide, a layer of single crystal semiconductor material on the layer of dielectric material such as silicon or silicon germanium, the layer of single crystal semiconductor material having a continuous recessed region having a first thickness, the recessed region patterned to leave a plurality of mesas surrounded by the recessed region, the mesas having a second thickness greater than the first thickness, at least two of the plurality of mesas each having at least one electronic device formed thereon, and interconnection wiring interconnecting the electronic devices on at least two of the plurality of mesas.

BRIEF DESCRIPTION OF THE DRAWING

These and other features, objects, and advantages of the present invention will become apparent upon a consideration of the following detailed description of the invention when read in conjunction with the drawings, in which.

DESCRIPTION OF THE PREFERRED EMBODIMENT

Figure 1:
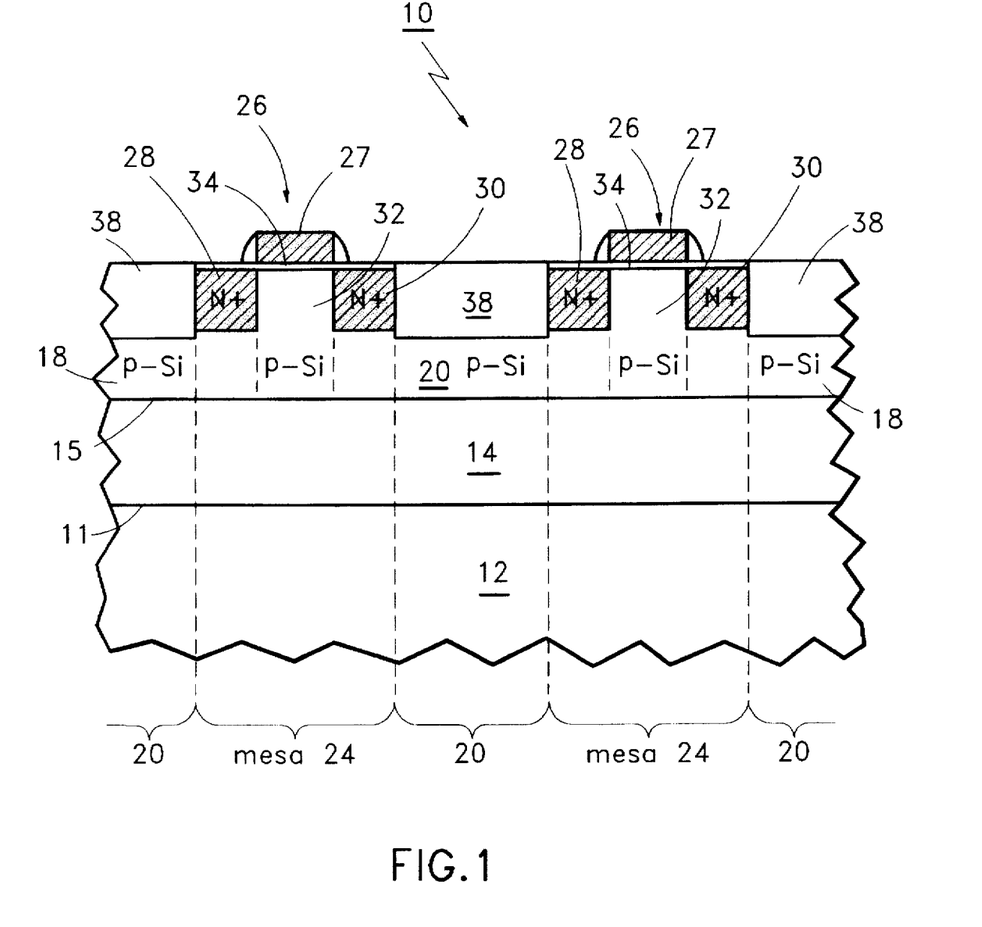
FIG. 1 is a cross section view along the line 1—1 of FIG. 3 showing one embodiment of the invention.

Referring to the drawing, FIG. 1 shows a cross section view of integrated circuit 10. A substrate 12 which may be a semiconductor such as silicon has a layer of dielectric material 14 on upper surface 11 of substrate 12. Dielectric material 14 may be selected from the group consisting of $SiO_2$ and $Si_3N_4$. Substrate 12 and dielectric material 14 may be combined as a substrate of sapphire. A layer of single crystal semiconductor material 18 such as silicon, SiGe, SiC, or GaAs is positioned on upper surface 15 of layer of dielectric material 14.

Substrate 12, and layers 14 and 18 may be formed by separation by ion implantation (SIMOX) or by bond and etch back techniques referred to as (BESOI), both of which are well known in the art.

Silicon layer 18 may be doped p type in the range from $1 \times 10^{17}$ to $2 \times 10^{18}$ atoms/cm and typically about $3 \times 10^{17}$ atoms/cm$^3$. Silicon layer 18 may have an original thickness in the range from about 140 nm to about 260 nm and have a recessed region of about half of the original thickness for example in the range from 60 to 100 nm thickness. Recessed region 20 may be patterned to leave a plurality of mesas 24 surrounded by the recessed region 20. A field effect transistor 26 may be formed in mesa 24 such as by ion implantation using the gate 27 which may be for example polysilicon to self align the drain 28 and source 30. AS shown in FIG. 1, Drain 28 and source 30 are n+ doped and the channel 32 is p type. Gate oxide 34 is formed between channel 32 and gate 27.

Figure 3:
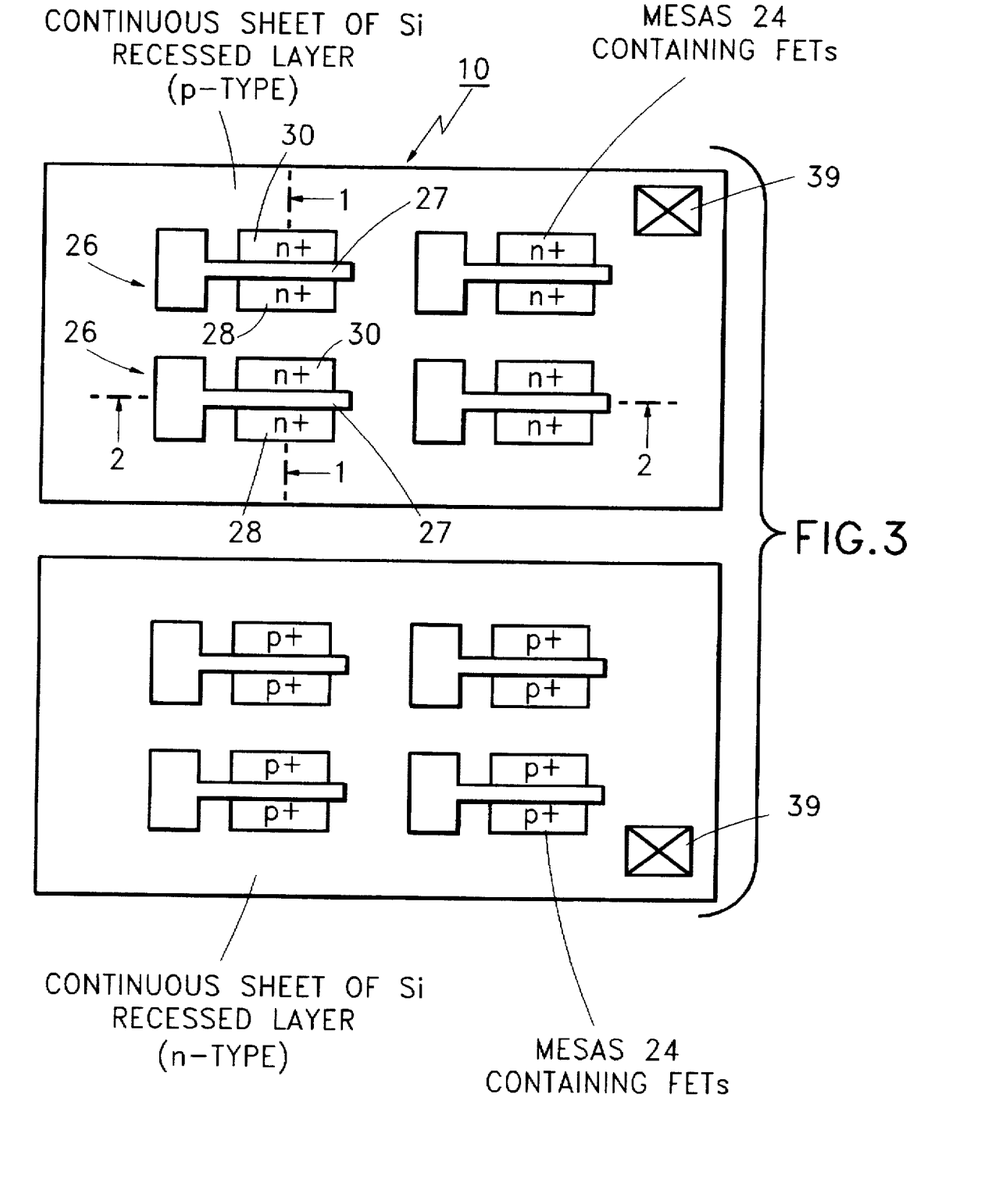
FIG. 3 is a top view of one embodiment of the invention.

Additional field effect transistors 26 may be fabricated on other mesas 24 shown in FIG. 3. The bodies of field effect transistors 26 on respective mesas 24 are in ohmic contact due to recessed region 20 of silicon layer 18. Recessed region 20 may be formed by thermal oxidation of silicon layer 18 in a selected pattern which results in a layer of field oxide 38 thereover. Since the body of the SOI field effect transistor 26 is now electrically linked together with other FET's 26, there is no need to make body contact for every SOI device. Instead, only one substrate contact 39 for the entire Si chip or at least for a large number of devices is needed. This avoids the area penalty, the wiring complexity and the layout changes that would normally be associated with making body contact to each FET device. It also ensures an easy migration of integrated circuit layouts from bulk design to SOI. In contrast, typical floating-body SOI CMOS devices use complete field oxidation of the silicon layer 18 between FET devices and holes can build up in the isolated bodies causing the floating-body effect. This method can also be applied to silicon-on-sapphire (SOS) structures in basically the same way as it applies to the SOI structure to suppress the FET floating-body effects.

Figure 2:
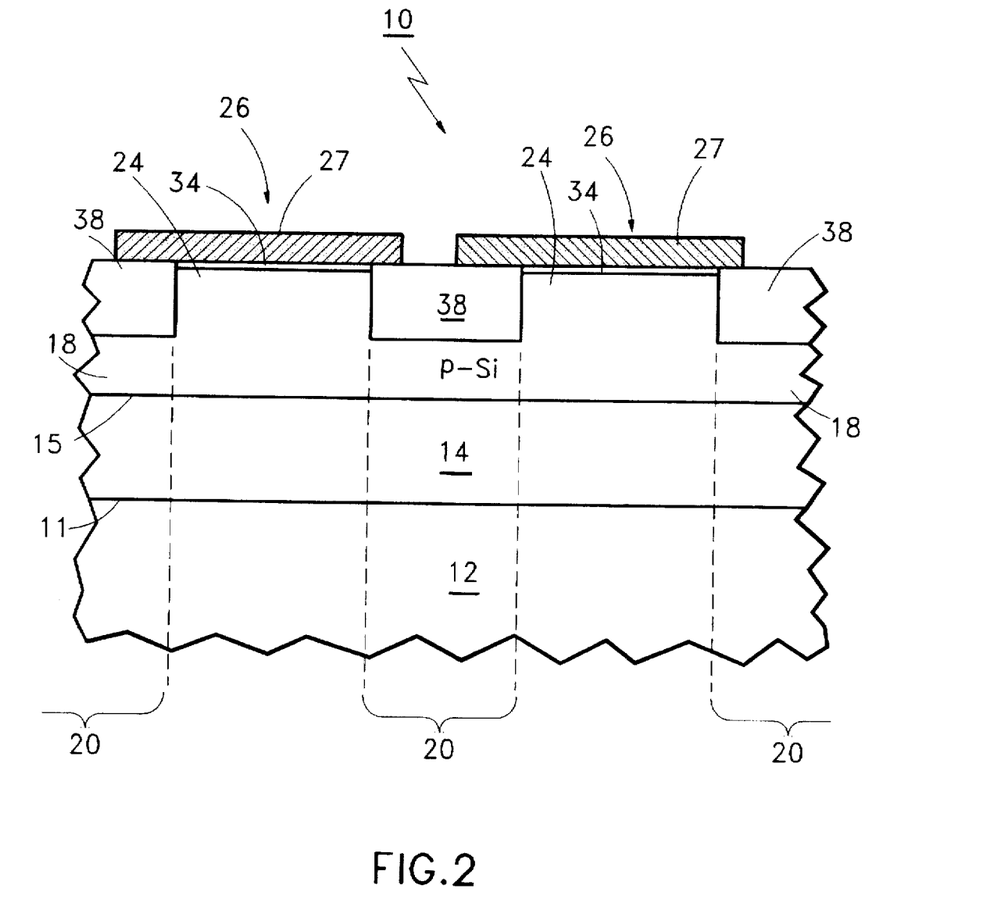
FIG. 2 is a cross section view along the line 2—2 of FIG. 3.

The recessed region 20 underneath field oxide 38 shown in FIGS. 1 and 2 is essentially two-dimensional as shown in the top view in FIG. 3. The advantage arising from this is that the series resistance between the body of a SOI FET device and the substrate contact 39 is basically independent (or very little dependent) on the distance between the SOI FET device and substrate contact 39. The series resistance is of the order of the sheet resistance of the remaining recessed region 20 of Si layer 18. FOR A TYPICAL DOPING LEVEL OF $3 \times 10^{17}$ atoms/cm$^3$, the sheet resistance of the two-dimensional link is about 20 Kohm per square. This resistance is in contrast to a one-dimensional link whose resistance would be proportional to the distance between the SOI FET device and the substrate contact.

Because the same doping level may be used in the recessed region 20 as in the FET body, for example of the order of $3 \times 10^{17}$ atoms/cm$^3$, the depletion width between the n+source and/or drain and the recessed region 20 is approximately 600 Å. This depletion layer is thick enough and the tunneling current is negligible so that the entire remaining recessed region 20 may be used as a conduction path and no current flows between n+ source and/or drain and the recessed region 20.

Recessed region 20 may not be globally doped p+ due to high leakage currents. P+ doping which may be for example $1.0 \times 10^{20}$ atoms/cm$^3$, if put in immediate contact with the N+ source and/or drain of FET 26, would cause unacceptable high leakage currents. Thus recessed region 20 if globally doped should be doped as stated above so that the entire recessed region 20 may be used as a conduction path to link the bodies of the n channel FET's.

Another advantage of designing the recessed Si layer so that its doping level is essentially the same as the FET Si body doping level is that, in typical technology development, the body doping level is engineered in such a way that the leakage current between source and/or drain and the body is minimized.

The invention is particularly suitable for deep submicron MOSFET device structures. For a deep submicron MOSFET device, the aspect ratio of the device (i.e. the ratio of gate width to length) is typically more than 20 and may be 80. The total resistance between the device body and the body contact is the sum of the resistance in the active device body and the resistance in the recessed region 20. In deep submicron devices, the former is much larger than the latter.

During operation of an inverter, the gate sometimes is in the on state (the high voltage state), the voltage (typically about 2 V) can cause a small depletion region in the recessed Si layer underneath this gate. For a typical STI oxide thickness of 1000 Å (see FIG. 2), the depletion width is estimated to be less than 100 Å which is much smaller than the layer thickness of recessed region 20. Therefore the electric conductance of the recessed region 20 is essentially unaffected.

In the case that is necessary to suppress the unwanted latch-up effects in CMOS circuits due to npnp regions, complete field oxidation between n and p channel FET's may be used. However, incomplete field oxidation would still be used between a plurality of n channel FET's. With complete field oxidation of the silicon layer between n and p channel FET's, the linked-body CMOS FET devices operate without latchup. One example is shown in FIG. 4, where a chain or series of CMOS inverters are connected as part of a ring oscillator or amplifier.

Figure 4:
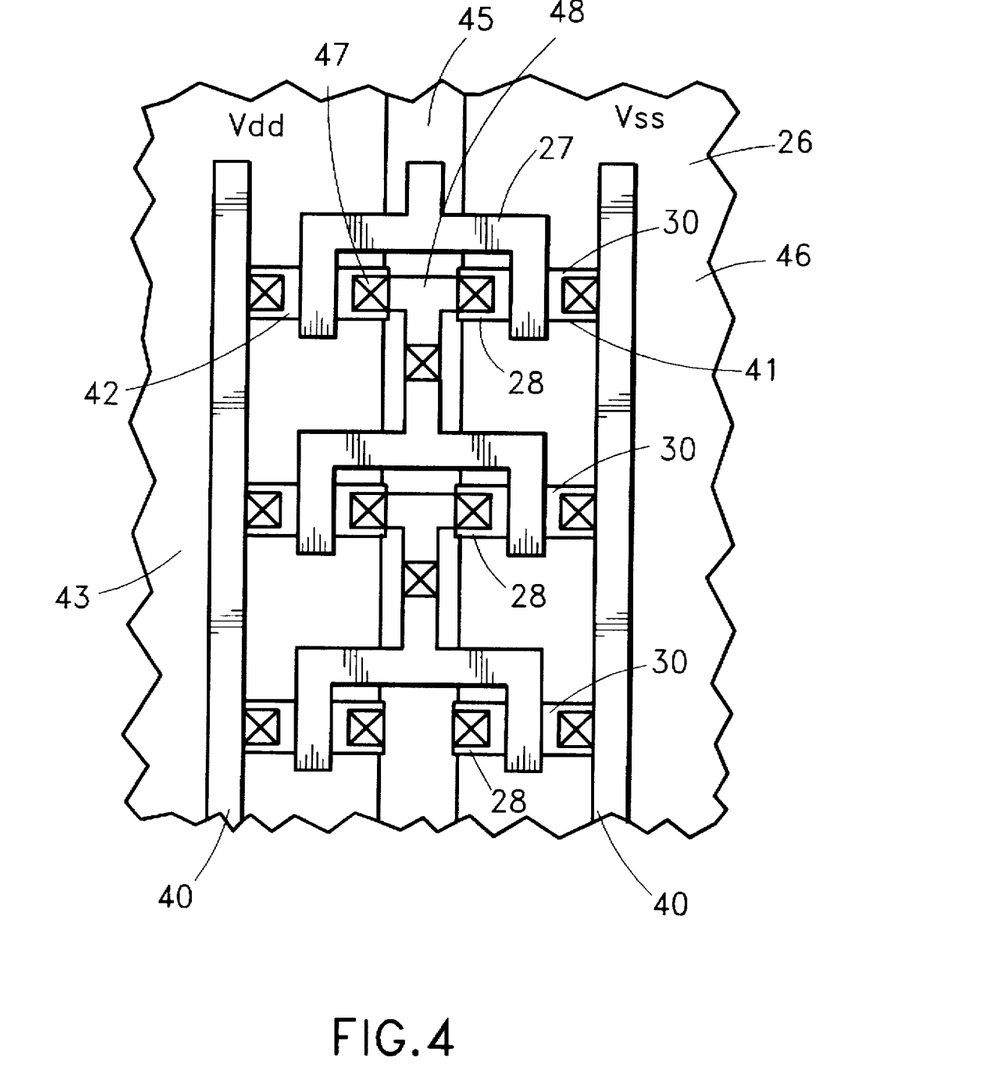
FIG. 4 is a top view of a plurality of CMOS FET inverter circuits coupled in series.

In FIG. 4, the recessed p-type Si layer 46 (connecting the NFET transistor 41 bodies) is separated from the recessed n-type Si layer 43 (connecting the PFET transistor 42 bodies) by the isolation region 45. The sources 30 of the pull-down NFET transistors 41 are connected to ground $V_{ss}$ while those of the pull-up PFET transistors 40 are connected to $V_{dd}$. The gate 27 drives the two transistors 42, 41 and the two drains '28, 47' of the transistors form the output 48' of the inverter to drive the next inverter stage.

Figure 5:
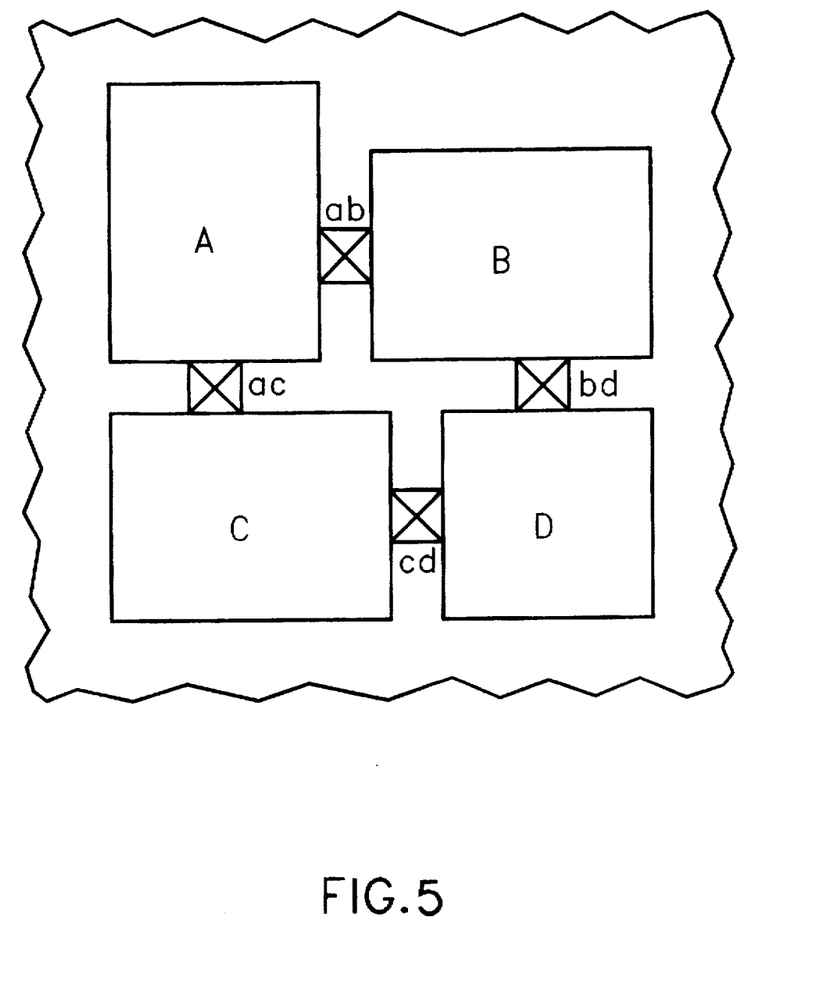
FIG. 5 is a top view of an alternate embodiment of the invention.

Extending the above approach, various semiconductor islands of device networks may be made as shown in FIG. 5. Within each island (A, B, C or D), there is a continuous sheet of recessed Si layer to provide for the conduction path. Complete field oxidation may be used between these islands A–D so that the islands are electrically isolated from each other.

Electric switches (such as switches ab, ac, and bd) can be applied beween the islands A–D. When a switch is on, the two islands become electrically connected. Such a switch can be made of a MOSFET or a CMOS pass gate or transmission gate.

The state of the switch is controlled by the voltage set on the gate. If the 'voltage' to the gate is set externally it acts as a static switch. If the input voltage of the gate is driven by the output signals of logic devices, it can act as a conditional switch depending upon the logic, functioning dynamically in response to data or control signals.

Controlled experiments have been performed on both the linked-body SOI FET according to the instant invention and the floating body SOI FET of the prior art that were processed nearly identically during device fabrication. The linked-body FET structure of this invention used a BESOI wafer as the substrate and has a Si channel thickness, channel 32, of 140 nm. Approximately 70 nm of Si was consumed during the incomplete field oxidation step. The Si thickness is chosen such that there are neutral regions under the channel 32 and in recessed region 20 for electrical linkage, yet silicon layer 18 is fully-depleted under drain '28' and source 30 junctions for eliminating the parasitic capacitance and gaining circuit speed. In the case that it is necessary, counter-doping by ion implantation can be applied to underneath the source/drain to make the area beneath the source and drain fully depleted. The fabrication design target of the effective gate length $L_{eff}$ of gate 27 was 0.25 µm. The linked-body SOI FET approach of this invention should be applicable to gate lengths of about 0.1 µm for SOI CMOS circuits.

The sheet resistance of recessed region 20 is estimated to be of the order of 20 Kohm/sq. This number is related to the doping level in recessed region 20 or link area. No additional doping to recessed region 20 was introduced. Recessed region 20 basically has the same doping level as channel 32 of FET 26 of $3\times10^{17}/cm^3$. Additional doping may be introduced for example by ion implantation to reduce the sheet resistance of recessed region 20 of silicon layer 18 even further.

The recessed region 20 of silicon layer 18 of this invention can also be applied to shallow trench isolation (STI) circumstances without any technical problem. In shallow trench isolation, a trench or recess is formed with reactive ion etching and then filled by chemical vacuum deposition (CVD) of silicon dioxide. The upper surface is then planarized with the upper silicon surface protected from the 'REI' process by chemical mechanical polishing (CMP). A plurality of mesas may be formed in this manner by performing the RIE through a mask.

The linked-body method requires minimal changes in the CMOS processing steps. The only modified process steps of the recessed region 20 from the present floating body SOI FET occurs in the field oxidation or shallow trench isolation (STI) section, which are independent of lithographical steps that define the dimensions of the devices. Therefore, this method should be applicable to the smallest gate length that the CMOS process is capable of producing.

Figure 6:
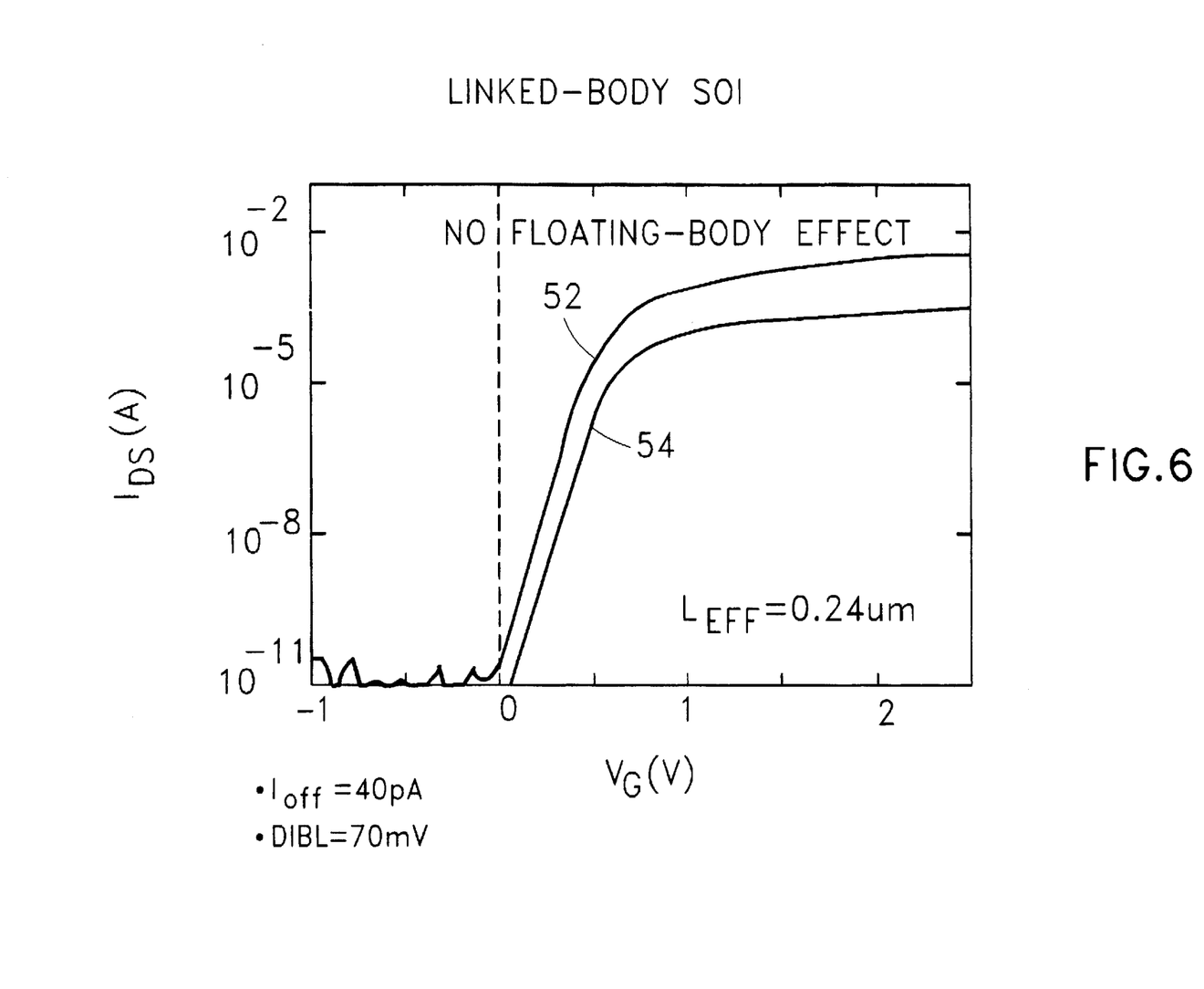
FIG. 6 is a graph of $I_{DS}$ versus $V_G$ for a field effect transistor shown in FIGS. 1–3.
Figure 7:
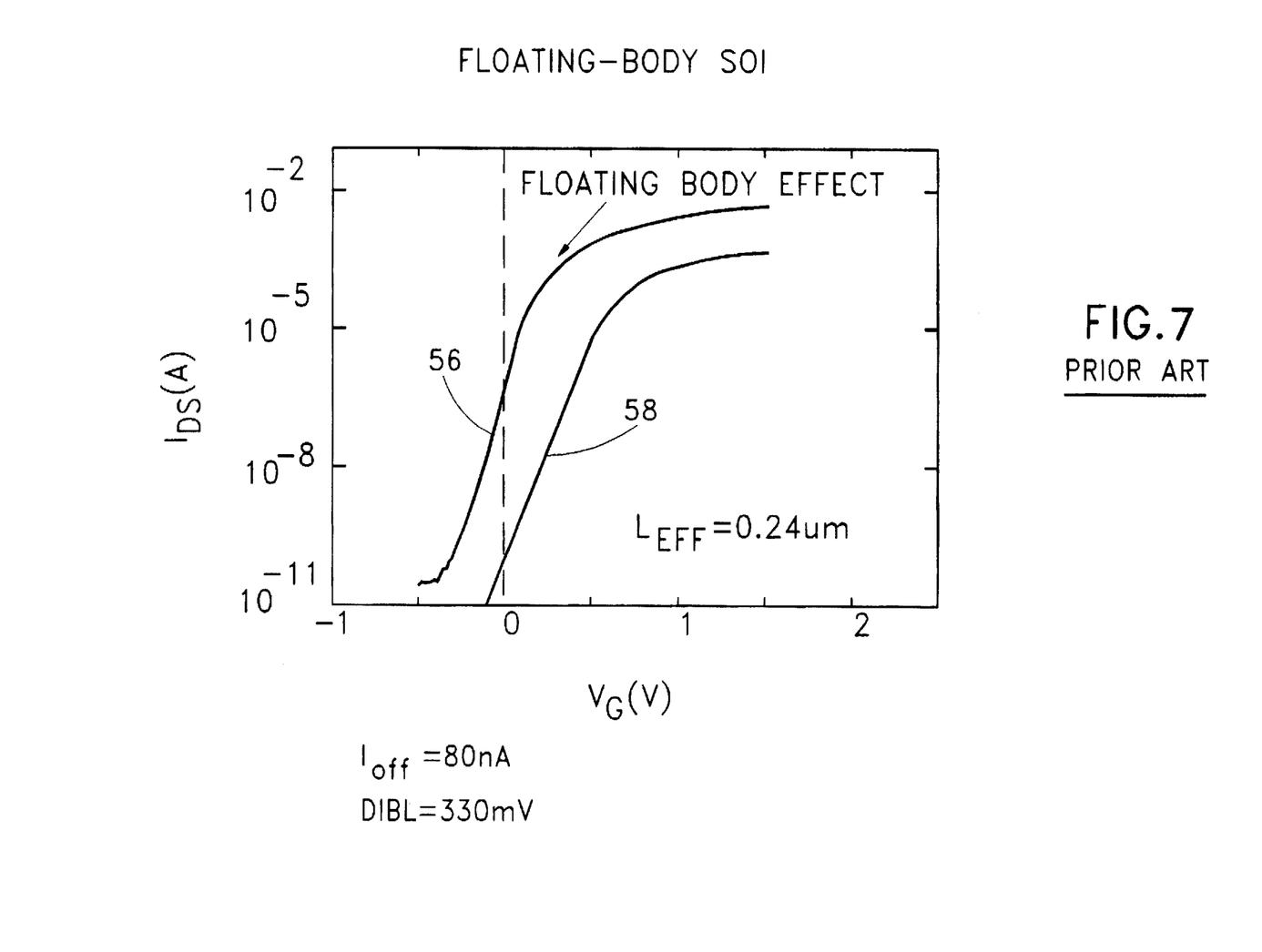
FIG. 7 is a graph of $I_{DS}$ versus $V_G$ for a field effect transistor with a floating body of the prior art.
Figure 8:
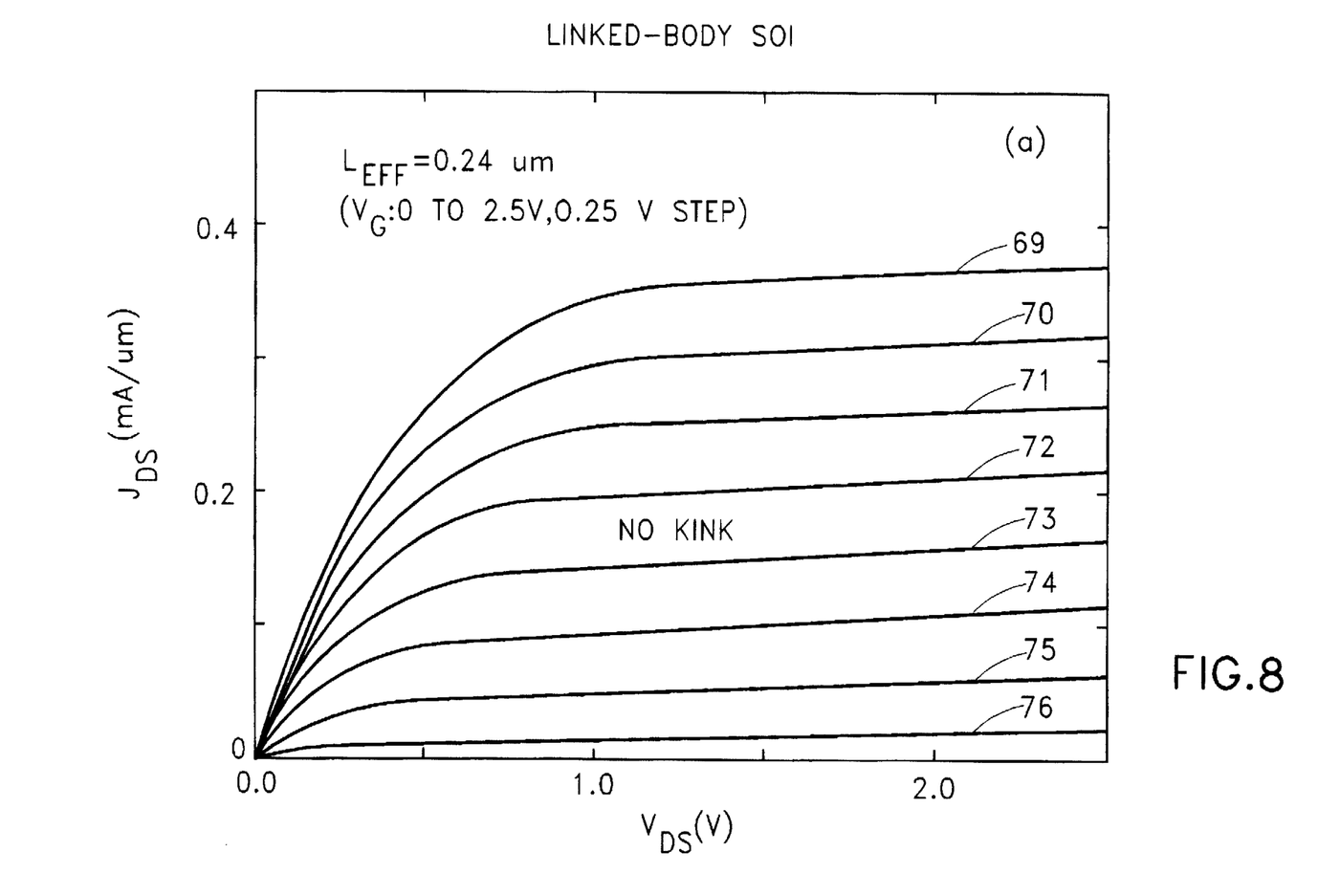
FIG. 8 is a graph of $I_{DS}$ versus $V_{DS}$ for a field effect transistor shown in FIGS. 1–3.
Figure 9:
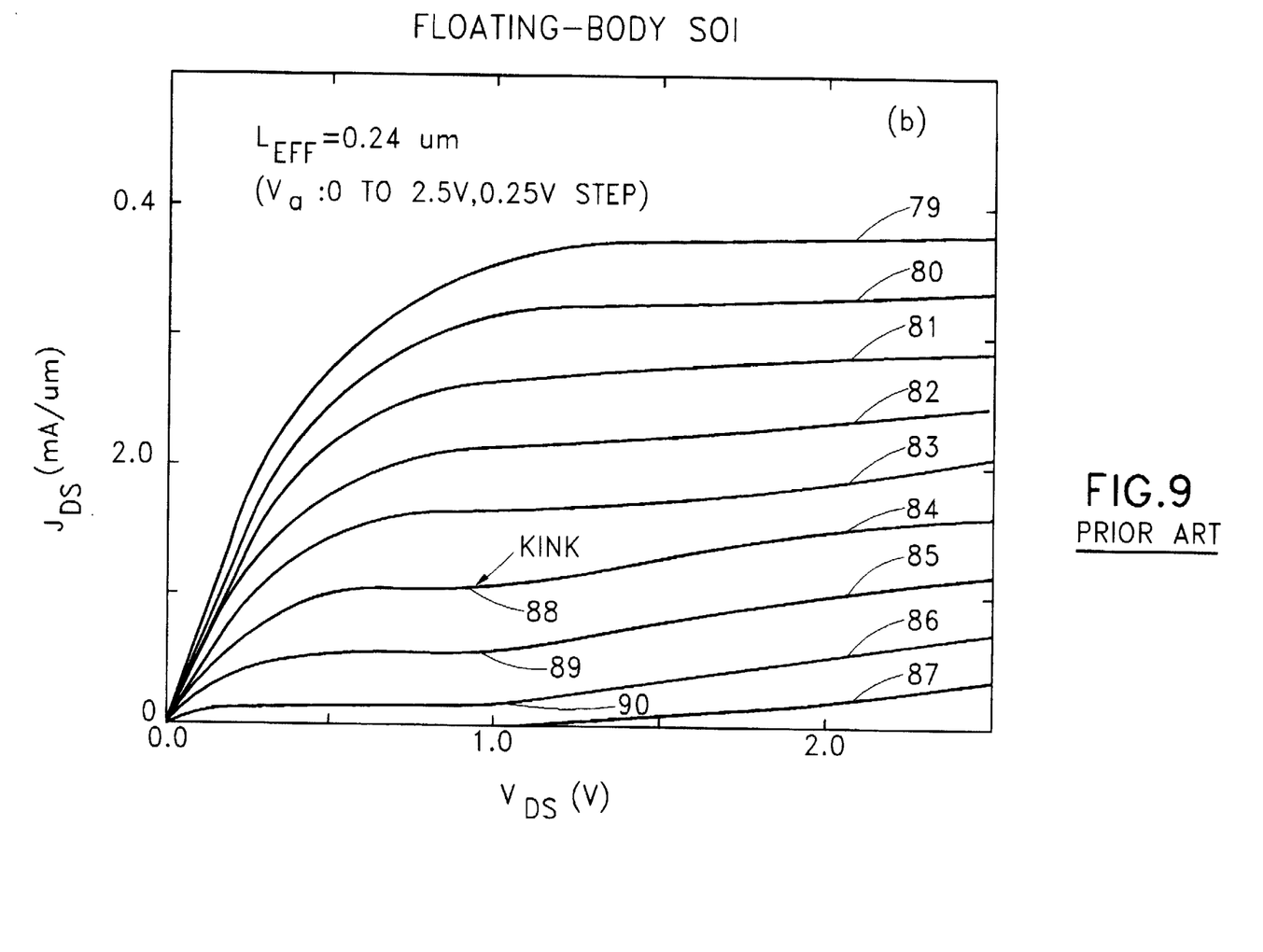
FIG. 9 is a graph of $I_{DS}$ versus $V_{DS}$ for a field effect transistor with a floating body of the prior art.

The comparison of the $I_{DS}$-$V_G$ characteristics of a linked-body NMOS FET device shown in FIGS. 6 and 8 and a floating body SOI NMOS FET device of the prior art shown in FIGS. 7 and 9. Both linked-body and 'floating body' SOI FET's have a $L_{eff}$ equal to 0.24 µm. In FIGS. 6 and 7, the ordinate represents $I_{DS}$ and the abscissa represents $V_G$. In FIGS. 8 and 9, the ordinate represents $I_{DS}$ and the abscissa represents $V_{DS}$. No 'floating body' effect was observed for 'linked-body' SOI FET's as shown by curves 52 and 54 in FIG. 6 and by curves 69-76 in FIG. 8. In FIG. 6, curve 52 was plotted from data measured with $V_{DS}$ equal to 2.5 V (high drain). Curve 54 was plotted from data measured with $V_{DS}$ equal to 50 mV (low drain). In FIG. 8, Curve 69 was plotted from data measured with Vequal to 2.5 V. Curves 70-76 were plotted from data measured with $V_G$ equal to 2.25 to 0.75 V in 0.25 V increments. Gate voltages of 0.5 V, 0.25 V and 0 V produced curves coinciding with the abscissa. The linked-body FET 26 had a $V_4$ equal to 0.57 V, and a drain induced barrier lowering (DIBL) of 70 mV.

In comparison, $I_{DS}$-$V_G$ curves 56 and 58 in FIG. 7 were plotted from data measured from a regular floating-body SOI FET device with $V_{DS}$ equal to 2.5 v (high drain) and 50 mV (low drain) respectively. The floating-body FET device as shown in FIG. 7 had a $V_T$ equal to 0.58 V and a DIBL of 330 mV.

FIG. 9 shows curves 79-87 with kinks such as at points 88-90 and an enormous subthreshold slope. Curve 79 was plotted from data measured with $V_G$ equal to 2.5 V. Curves 80-87 were plotted from data measured with $V_G$ equal to 2.25 V to 0.5 V in 0.25 steps. The kinks in curves 81-90 and the large threshold voltage shift with increasing drain voltage are both clear indications of the floating-body effect in the SOI FET device of the prior art.

While both the $G_m$'s and the on currents of the two SOI FET devices are comparable, the off-state currents ($I_{eff}$ measured at $V_g$ equals 0 Volts) are dramatically different as shown in FIGS. 6 and 7. $I_{eff}$ for the linked-body SOI FET in FIG. 6 is 40 pA, while $I_{eff}$ for the floating-body SOI FET in FIG. 7 is 79 nA which is 2000 times greater.

The impact ionization of hot electrons in the FET channel is the cause or culprit for causing holes which in turn cause the floating body effects. Therfore floating body effects mainly affects n channel MOSFET's.

Figure 10:
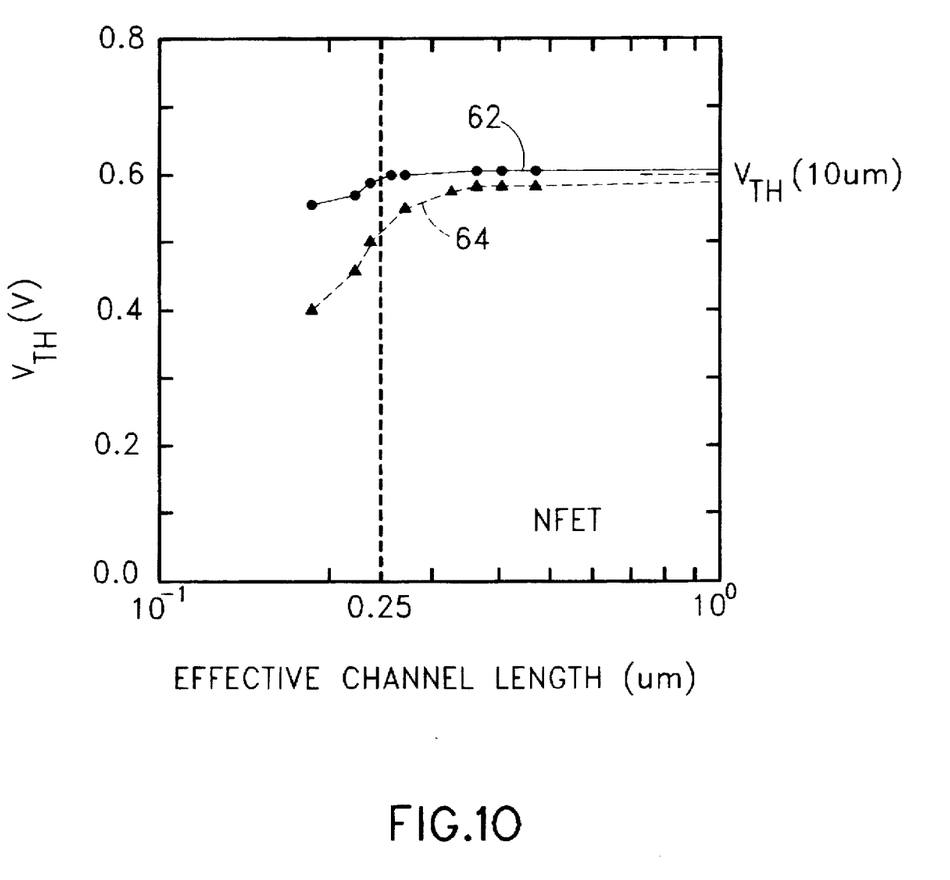
FIG. 10 is a graph of the threshold voltage $V_{TH}$ versus the effective channel length $L_{eff}$ for the FET embodiment shown in FIGS. 1–3.
Figure 11:
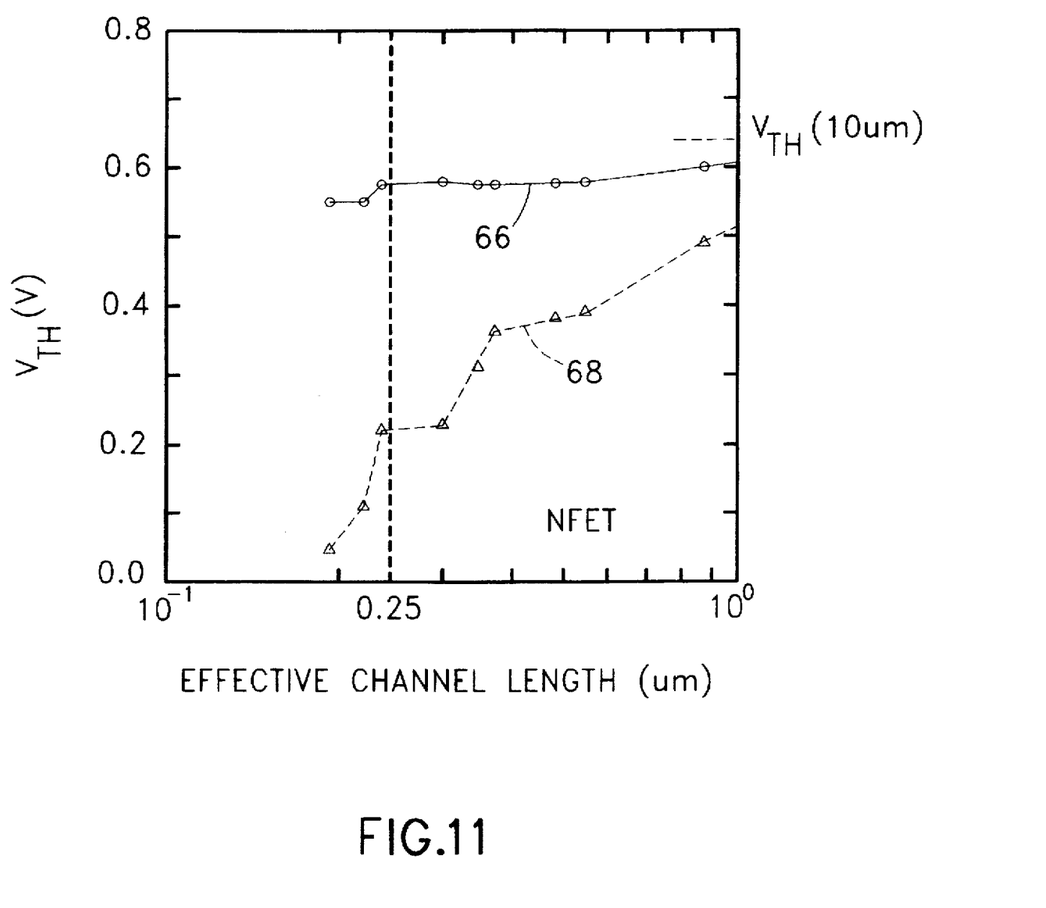
FIG. 11 is a graph of the threshold voltage $V_{TH}$ versus the effective channel length $L_{eff}$ for the floating body SOI FET of the prior art.

Better short channel effect of the linked-body SOI NFET's is shown in FIG. 10. In FIG. 10, the ordinate represents threshold voltage $V_{TH}$ and the abscissa represents effective channel length. At an effective gate length $L_{eff}$ equal to 0.25 µm, the threshold voltage V roll-off is 100 mV for a high drain voltage of $V_{DS}$ equal to 2.5 V and 30 mV for a low drain voltage of $V_{DS}$ equal to 0.05 V. The threshold voltage for high-drain voltage are plotted as solid circles in FIG. 10 and are shown by curve 62. The threshold voltage for low-drain voltage are plotted as solid triangles in FIG. 10 and are shown by curve 64. The threshold voltage as shown by curves 62 and 64 are much better than those of the floating-body SOI FET devices shown in FIG. 11 by curves 66 and 68, respectively. This is mainly because of the significant improvement of DIBL in linked-body SOI FET devices. In FIG. 11 the ordinate represents threshold voltage and the abscissa represents effective channel length. The open circles are plotted for the threshold voltage with high-drain voltage and are interconnected by curve 66. The open triangles are plotted for the threshold voltage with low-drain voltage and are interconnected by curve 68.

Figure 12:
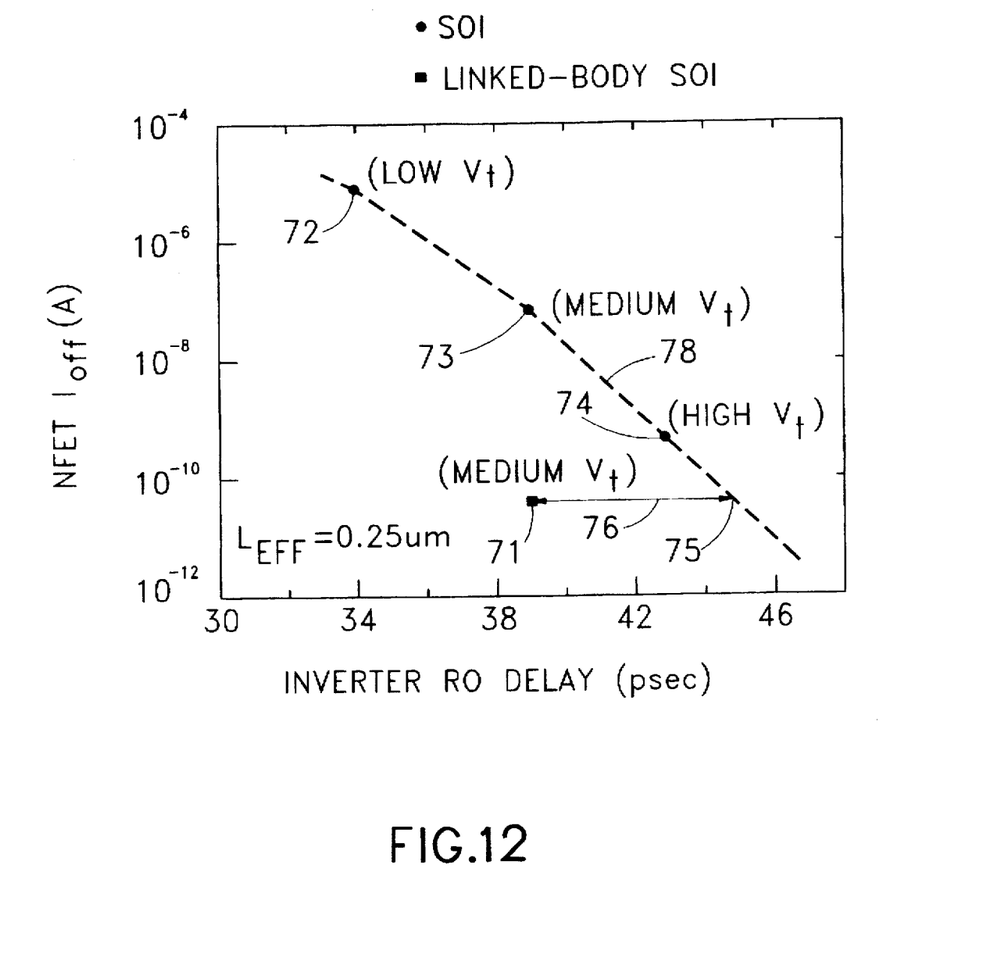
FIG. 12 is a graph of an n channel FET off current $I_{off}$ versus ring oscillator (RO) delay which uses the FET's of FIGS. 1–3 and for a RO which uses floating body the regular SOI FET's of the prior art.

Referring to FIG. 12, the high performance of the linked-body SOI FET's when interconnected into ring oscillators is shown. In FIG. 12, the ordinate represents the FET off-current and the abscissa represents the inverter ring oscillator delay. Data point 71 was plotted from measurements from a RO using linked-body SOI FET's. Data points 72-74 were plotted from measurements from a RO using floating body SOI FET's. Data points 72-74 were interconnected by curve 78. The linked-body FET SOI ring oscillator is as fast as a floating body SOI FET device for the same $L_{eff}$ and $V_+$ at low-drain source voltage of 0.05 V; and both are 20% faster than the ring oscillator built with FET's on bulk Si. The linked-body SOI FET and the floating body SOI FET devices also have similar $f_+$ values. In order to satisfy the off-current requirement, the $V_+$ at low-drain voltage of the floating body SOI FET device must be raised, which degrades its performance.

FIG. 12 clearly shows by data points 71-74 the SOI FET device off-current versus ring oscillator delay. The off-current of the linked-body SOI FET device is about 2000 times smaller as shown by data point 71 than that of the floating-body SOI FET device shown by data point 73. If the linked-body SOI FET device is compared to the floating-body SOI FET device with the same $L_{eff}$, the linked-body SOI FET ring oscillator is about 15% faster than the regular SOI FET ring oscillator as shown by arrow 76 between point 75 on curve 78 and point 71.

Figure 13:
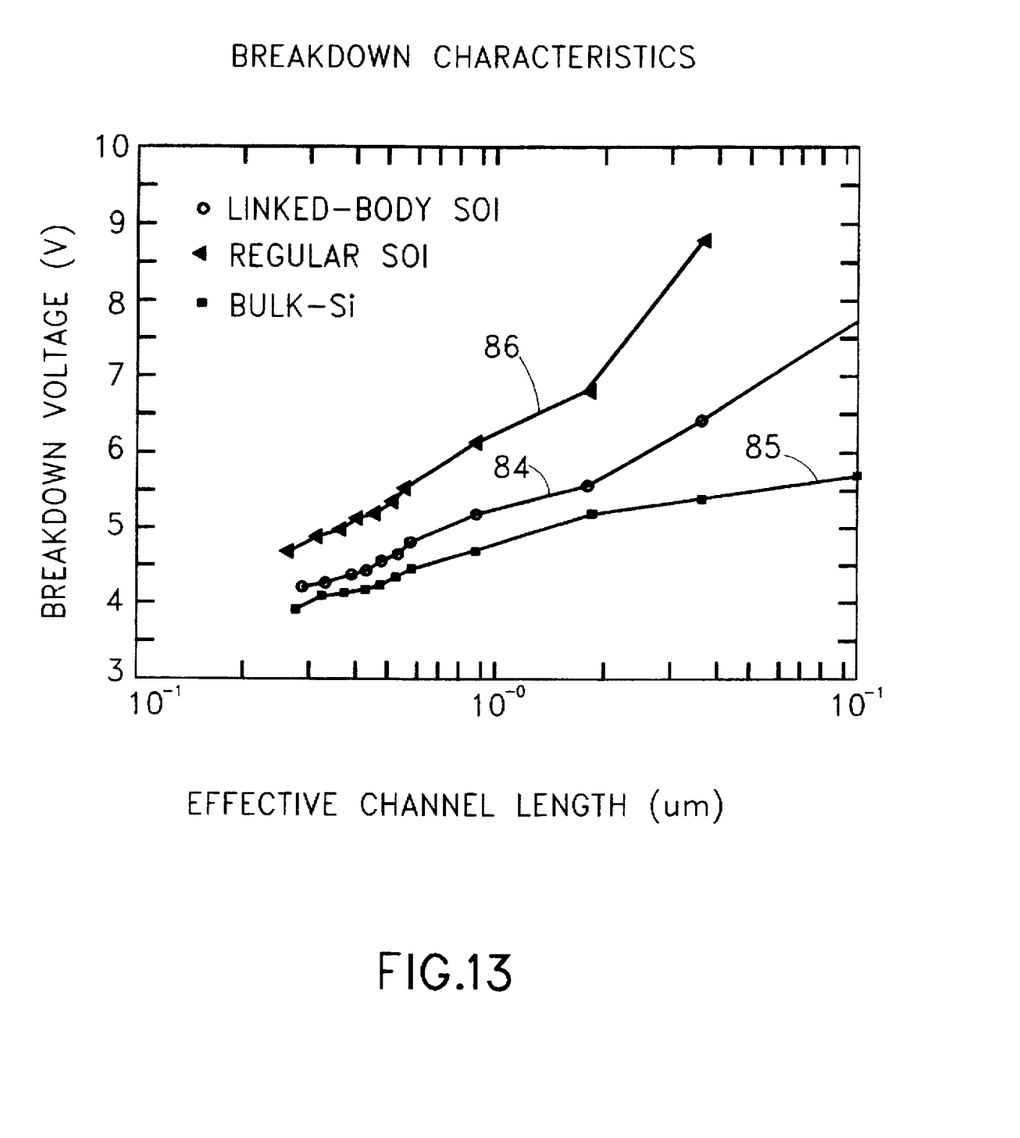
FIG. 13 is a graph of the breakdown voltage $V_{dd}$ versus effective channel length $L_{eff}$ for the SOI FET's of FIGS. 1–3, floating body SOI FET's and bulk Si FET's.

FIG. 13 is a graph of the drain source breakdown voltage versus the effective channel length for linked body SOI FET devices, floating-body SOI FET devices and bulk Si FET devices. In FIG. 13, the ordinate represents breakdown voltage and the abscissa represents effective channel length. Curves 84–86 show the breakdown voltage for linked body SOI FET devices, floating body SOI FET devices and bulk Si FET devices respectively. Curves 84–86 interconnect respective data points plotted from laboratory measurements. The breakdown voltages of the sub-micron linked-body SOI FET devices are about 0.4 V higher than those of the floating-body SOI FET device with the same effective channel length $L_{eff}$ due to suppression of the parasitic bipolar transistor effect in linked-body SOI FET devices. Because of the suppression of the parasitic bipolar action and the linked body SOI FET device isolation by the buried oxide layer, the soft error rate in linked-body SOI FET static random access memory (SRAM) should be improved over that of the floating body SOI FET SRAM as well as the bulk Si FET SRAM.

Transient I-V measurements show that the history effects of the transient current overshoot have been effectively suppressed in the linked-body SOI FET device down to the resolution limit of the instruments used to make the measurements which was 300 nsec. With appropriate doping concentration in recessed region 20, the RC time constant in the body link or recessed region 20 from a respective channel to substrate contact 39 can be as short as or less than 1 nsec.

The transient current overshoot is believed to be caused by a history effect due to transient charging and discharging of the floating body in a SOI FET device. In a linked-body SOI FET device, the excess holes displaced due to the formation of the depletion region during gate or drain/source switching is redistributed very rapidly over the entire p-type body linked over the integrated circuit chip or wafer so that the changes in hole concentration in the active SOI FET device and changes in the body potential are negligible as long as the SOI FET device is not biased in a strong electron impact ionization regime where excessive holes are generated.

The linked-body SOI FET device structure effectively suppresses the unwanted floating-body SOI FET effects in SOI MOSFET's. The linked-body SOI FET ring oscillator is as fast as the floating-body SOI FET ring oscillator for the same $L_{eff}$ and V, but with a much lower $I_{off}$. The low off-state current and the absence of kinks in the linked body SOI FET device $I_{DS}$-$V_+$, curves as shown in FIG. 8, make the linked-body SOI FET device structure an attractive SOI FET device for both digital and analog applications.

While there has been described and illustrated an integrated circuit with SOI FET devices formed on respective mesas with the mesas interconnected by a thin common semiconductor layer extending between the mesas, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An integrate circuit comprising:

a substrate of dielectric material, a continuous sheet of single crystal semiconductor material on said substrate of dielectric material, said continuous sheet of single crystal semiconductor material having a continuous recessed region having a first thickness, said recessed region being patterned to leave a plurality of mesas surrounded by said recessed region, said mesas having a second thickness greater than said first thickness, a plurality of said mesas each having at least one field effect transistor formed thereon, each said field effect transistor having a source, drain, a channel therebetween, and a gate, wherein said second thickness is selected to permit said drain and source to form a substantially fully depleted depletion region extending to said substrate below each of said drain and source, respectively, while leaving therebetween and under said channel a neutral, partially depleted region of said recessed region for interconnection with adjoining regions of said recessed region of said continuous sheet, said continuous sheet of single crystal semiconductor material serving as two-dimensional ohmic interconnection between at least two of said field effect transistors, said field effect transistors being of the same channel type, and said continuous sheet of single semiconductor material having a common substrate contact for interconnecting a plurality of said field effect transistors thereto.

2. The integrated circuit of claim 1, wherein said recessed region and said plurality of mesas have a common concentration of p type doping.

3. The integrated circuit of claim 1, wherein each said field effect transistor has an n channel, a source, a gate, a gate oxide, and a body.

4. The integrate circuit of claim 1, further including a plurality of sheets of single crystal semiconductor material spaced apart on said layer of dielectric material.

5. The integrated circuit of claim 4, wherein at least one of said plurality of sheets is coupled electrically through a switch to another of said plurality of sheets.

* * * * *